United States Patent
Jung

(10) Patent No.: US 12,051,348 B2
(45) Date of Patent: Jul. 30, 2024

(54) DISPLAY DEVICE

(71) Applicant: Samsung Display Co., LTD., Yongin-si (KR)

(72) Inventor: Haegoo Jung, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/123,335

(22) Filed: Mar. 20, 2023

(65) Prior Publication Data

US 2023/0230516 A1 Jul. 20, 2023

Related U.S. Application Data

(63) Continuation of application No. 17/713,243, filed on Apr. 5, 2022, now Pat. No. 11,640,775, which is a
(Continued)

(30) Foreign Application Priority Data

Jan. 10, 2018 (KR) .................. 10-2018-0003505

(51) Int. Cl.
*G09G 3/00* (2006.01)
*G09G 3/3225* (2016.01)
(Continued)

(52) U.S. Cl.
CPC .......... *G09G 3/006* (2013.01); *G09G 3/3225* (2013.01); *H10K 59/131* (2023.02); *H10K 59/35* (2023.02);
(Continued)

(58) Field of Classification Search
CPC ............ G09G 3/00; G09G 3/006; G09G 3/20; G09G 3/30; G09G 3/3233; G09G 3/3266;
(Continued)

(56) References Cited

U.S. PATENT DOCUMENTS 9,454,684 B2 9/2016 Hsiao et al.
9,653,368 B2 5/2017 Kwak
(Continued)

FOREIGN PATENT DOCUMENTS

| CN | 102326192 | 1/2012 |
|---|---|---|
| CN | 107255655 | 10/2017 |

(Continued)

OTHER PUBLICATIONS

Non-Final Office Action dated Apr. 9, 2020, issued to U.S. Appl. No. 16/218.487.
(Continued)

*Primary Examiner* — Neel D Shah
(74) *Attorney, Agent, or Firm* — KILE PARK REED & HOUTTEMAN PLLC

(57) ABSTRACT

A display device including a substrate having a display area and a non-display area outside the display area, a plurality of pixels disposed on the substrate in the display area, an external circuit bonded on the substrate in the non-display area, a first signal line disposed on the substrate in the non-display area and surrounding at least a portion of the display area, the first signal line being electrically connected to the external circuit, and a second signal line disposed in the non-display area and surrounding at least a portion of the first signal line, the second signal line being electrically connected to the external circuits.

9 Claims, 8 Drawing Sheets

Related U.S. Application Data continuation of application No. 17/114,197, filed on Dec. 7, 2020, now Pat. No. 11,302,226, which is a continuation of application No. 16/218,487, filed on Dec. 13, 2018, now Pat. No. 10,891,883.

(51) Int. Cl.
  *G09G 3/3275* (2016.01)
  *H10K 59/131* (2023.01)
  *H10K 59/35* (2023.01)

(52) U.S. Cl.
  CPC ... *G09G 3/3275* (2013.01); *G09G 2300/0426* (2013.01); *G09G 2300/0452* (2013.01); *G09G 2330/12* (2013.01)

(58) Field of Classification Search
  CPC ....... H01L 27/32; H01L 27/323; H01L 21/66; H01L 21/304
  See application file for complete search history.

(56) References Cited

U.S. PATENT DOCUMENTS

| | | | |
|---|---|---|---|
| 9,928,768 | B2 | 3/2018 | Kim et al. |
| 2011/0275270 | A1 | 11/2011 | Matsuoka et al. |
| 2016/0043010 | A1* | 2/2016 | Kwak ................ H01L 22/14 438/15 |
| 2016/0225312 | A1 | 8/2016 | Byun et al. |
| 2016/0293884 | A1 | 10/2016 | Zhang et al. |
| 2016/0322451 | A1 | 11/2016 | Park |
| 2016/0351093 | A1 | 12/2016 | Kim et al. |
| 2017/0213490 | A1 | 7/2017 | Jeong et al. |
| 2017/0263880 | A1 | 9/2017 | Lee et al. |
| 2017/0270842 | A1 | 9/2017 | Nam et al. |
| 2022/0271229 | A1 | 8/2022 | Kwak et al. |

FOREIGN PATENT DOCUMENTS

| | | |
|---|---|---|
| KR | 10-2015-0136999 | 8/2015 |
| KR | 10-2016-0017845 A | 2/2016 |
| KR | 10-2016-0139122 | 12/2016 |

OTHER PUBLICATIONS

Notice of Allowance dated Sep. 8, 2020, issued to U.S. Appl. No. 16/218.487.
Notice of Allowance dated Dec. 7, 2021, issued to U.S. Appl. No. 17/114,197.
Notice of Allowance dated Aug. 17, 2022, issued to Korean Patent Application No. 10-2018-0003505.
Non-Final Office Action dated Sep. 27, 2022, issued to U.S. Appl. No. 17/713,243.
Notice of Allowance dated Jan. 27, 2022, issued to U.S. Appl. No. 17/713,243.
Notice of Allowance issued for corresponding Korean Patent Application No. 10-2022-0151251 on May 30, 2023 (with English Concise Explanation).
Office Action issued for corresponding Chinese Patent Application No. 201910022793.X on Jan. 30, 2024 (with English Concise Explanation).

* cited by examiner

DISPLAY DEVICE

CROSS-REFERENCE TO RELATED APPLICATIONS

This application is a continuation of U.S. patent application Ser. No. 17/713,243, filed on Apr. 5, 2022, which is a continuation of U.S. patent application Ser. No. 17/114,197, filed on Dec. 7, 2020, now issued as U.S. Pat. No. 11,302,226, which is a continuation of U.S. patent application Ser. No. 16/218,487, filed on Dec. 13, 2018, now issued as U.S. Pat. No. 10,891,883, which claims priority from and the benefit of Korean Patent Application No. 10-2018-0003505, filed on Jan. 10, 2018, each of which is hereby incorporated by reference for all purposes as if fully set forth herein.

BACKGROUND

Field

Exemplary embodiments of the invention relate to a display device, and more particularly, to a display device capable of detecting a crack in a panel of the display device.

Discussion of the Background

A portable electronic device (such as a mobile phone, a navigation device, a digital camera, an electronic book, a portable game machine, or various kinds of terminals) typically uses a liquid crystal display (LCD) or an organic light emitting diode (OLED) display. A display device used in the portable electronic device has been developed to be flexible to improve the portability of the display device.

In general, panels of a display device are formed on a mother substrate, and the mother substrate is scribed to be separated into several panels. However, in the process of cutting the mother substrate, the periphery of the panel may become cracked. Thus, a method of detecting a crack in the panel of the display device is desired.

Moreover, a flexible display device may be achieved by manufacturing a display device of a flat type (or a flat display device) and then bending it. In this case, while the flat panel display is being bent, a substrate thereof may be cracked. When a crack of a small size (or a small size crack) occurs in the substrate, it may not be well detected during the early stage of manufacturing, and may not greatly affect the operation of the display device. However, as the size of the crack increases with the passage of time, moisture may be permeated inside the display device through a portion where the crack has occurred. When the moisture is permeated into the display device, reliability of the device may be deteriorated and may also affect the operation of the display device.

The above information disclosed in this Background section is only for understanding of the background of the inventive concepts, and, therefore, it may contain information that does not constitute prior art.

SUMMARY

Devices constructed according to exemplary embodiments of the invention are capable of detecting a crack in a panel of a display device.

Additional features of the inventive concepts will be set forth in the description which follows, and in part will be apparent from the description, or may be learned by practice of the inventive concepts.

A display device according to an exemplary embodiment includes a substrate including a display area and a non-display area outside the display area, a plurality of pixels disposed in the display area on the substrate, a plurality of data lines connected to the pixels, a first crack detection line disposed in the non-display area on the substrate, the first crack detection line being electrically connected to at least one of the data lines, and a second crack detection line disposed in the non-display area outside the first crack detection line, the second crack detection line being electrically connected to at least one of the data lines.

A first distance between the first crack detection line and the display area may be less than a second distance between the second crack detection line and the display area.

The first crack detection line and the second crack detection line may substantially surround at least three sides of the display area.

A length of the second crack detection line may be greater than a length of the first crack detection line.

The first crack detection line and the second crack detection line may be disposed on the same layer.

The first crack detection line and the second crack detection line may be disposed at different layers from each other.

Each of the pixels may include a transistor including a semiconductor layer, a gate insulation layer, a gate electrode, and an insulation interlayer sequentially disposed on the substrate, and a capacitor including a lower electrode disposed on the same layer as the gate electrode and an upper electrode disposed on the insulation interlayer.

The first crack detection line and the second crack detection line may be disposed on the same layer as one of the gate electrode and the upper electrode.

The first crack detection line may be disposed on the same layer as one of the gate electrode and the upper electrode, and the second crack detection line may be disposed on the same layer as the other of the gate electrode and the upper electrode.

The data lines may include a first data line electrically connected to a first pixel of the pixels and the first crack detection line, and a second data line electrically connected to a second pixel of the pixels and the second crack detection line.

The first pixel and the second pixel may emit different light of colors from each other.

The first pixel may emit one of red color and blue color, and the second pixel may emit the other one of red color and blue color.

The display device may further include a matching resistor disposed in the non-display area, the matching resistor being electrically connected to third data lines adjacent to the first data line or the second data line.

The first crack detection line, the second crack detection line, and the matching resistor may be configured to be applied with a voltage having the same magnitude.

A resistance of the matching resistor may be greater than a resistance of the first crack detection line and a resistance of the second crack detection line.

The display device may further include a first matching resistor disposed in the non-display area, the first matching resistor being electrically connected to third data lines adjacent to the first data line, and a second matching resistor disposed in the non-display area, the second matching resistor being electrically connected to fourth data lines adjacent to the second data line.

A resistance of the first matching resistor may be greater than a resistance of the first crack detection line, and a resistance of the second matching resistor may be greater than a resistance of the second crack detection line.

A resistance of the second matching resistor may be greater than a resistance of the first matching resistor.

The display device may further include a first switching element connecting the first data line to the first crack detection line and a second switching element connecting the second data line to the second crack detection line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
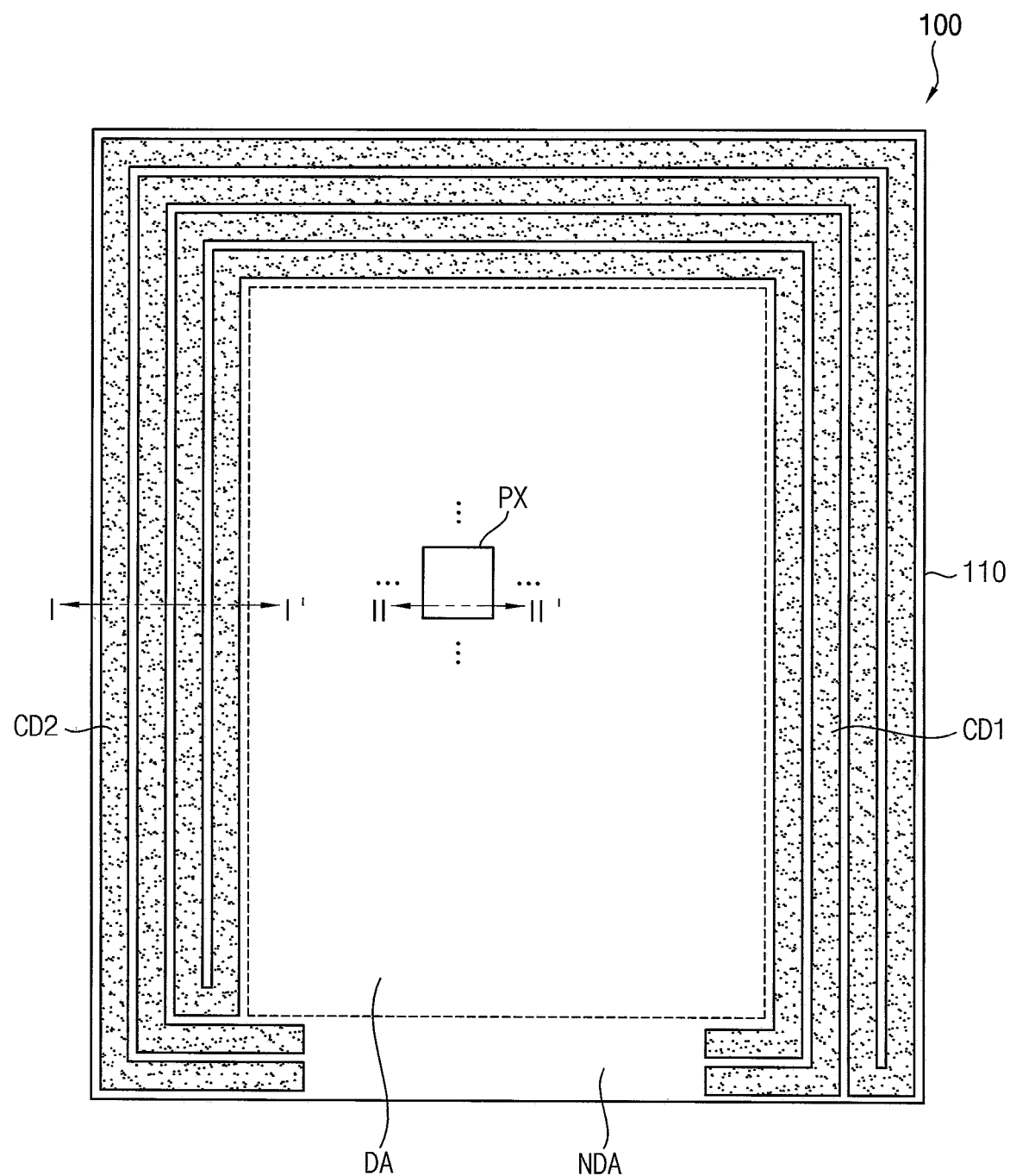
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device according to an exemplary embodiment.

Referring to FIG. 1, a display device 100 according to an exemplary embodiment may include a substrate 110, a plurality of pixels PX, a first crack detection line CD1, and a second crack detection line CD2.

The substrate 110 may include a display area DA and a non-display area NDA. An image may be displayed at the display area DA. The display area DA may be disposed at a center of the substrate 110. For example, the display area DA may have a substantially rectangular shape in a plan view. The non-display area NDA may be disposed outside the display area DA. For example, the non-display area NDA may substantially surround sides of the display area DA.

The pixels PX may be disposed in the display area DA of the substrate 110. For example, the pixels PX may be arranged in a substantially matrix form. The display area DA may display an image by combining light emitted from the pixels PX.

The first crack detection line CD1 and the second crack detection line CD2 may be disposed in the non-display area NDA of the substrate 110. When the non-display area NDA is cracked, the first crack detection line CD1 and/or the second crack detection line CD2 may be damaged. The display device 100 according to the illustrated exemplary embodiment may determine whether a crack has occurred or not by detecting a damage in the first crack detection line CD1 and/or the second crack detection line CD2. The first crack detection line CD1 may be disposed outside the display area DA, and the second crack detection line CD2 may be disposed outside the first crack detection line CD1.

A first distance between the first crack detection line CD1 and the display area DA may be less than a second distance between the second crack detection line CD2 and the display area DA. For example, the first distance may be a distance from a side of the display area DA to the first crack detection line CD1, and the second distance may be a distance from the side of the display area DA to the second crack detection line CD2. Accordingly, the first crack detection line CD1 may be disposed between the display area DA and the second crack detection line CD2. The display device 100 according to the illustrated exemplary embodiment may determine whether a crack has occurred or not by detecting the damage of the first crack detection line CD1 and/or the second crack detection line CD2, and may identify a relative position of the crack with respect to the display area DA.

The first crack detection line CD1 and the second crack detection line CD2 may substantially surround at least three sides of the display area DA. In an exemplary embodiment, the display area DA may have an upper surface, a lower surface, a left side surface, and a right side surface as illustrated in FIG. 1. The first crack detection line CD1 and the second crack detection line CD2 may substantially surround the upper surface, the left side surface, and the right side surface of the display area DA. For example, the first crack detection line CD1 may extend in a counter-clockwise direction from a lower right side of the non-display area NDA along the right side surface, the upper surface, and the left side surface of the display area DA, and then may change a direction and extend in a clockwise direction along the left side surface, the upper surface, and the right side surface of the display area DA. Further, the second crack detection line CD2 may extend in a clockwise direction from a lower left side of the non-display area NDA along the left side surface, the upper surface, and the right side surface of the display area DA, and then may change a direction and extend in a counter-clockwise direction along the right side surface, the upper surface, and the left side surface of the display area DA.

A length of the second crack detection line CD2 may be greater than a length of the first crack detection line CD1. As used herein, the length of each of the first crack detection line CD1 and the second crack detection line CD2 may be a length in a direction substantially in parallel with a direction in which the first crack detection line CD1 and the second crack detection line CD2 are extended. The second crack detection line CD2 may be disposed outside the first crack detection line CD1, and the second crack detection line CD2 may surround the first crack detection line CD1 that surrounds the display area DA. Accordingly, the second crack detection line CD2 may be formed to be longer than the first crack detection line CD1. Further, a width of the first crack detection line CD1 may be substantially the same as a width of the second crack detection line CD2. As used herein, the width of each of the first crack detection line CD1 and the second crack detection line CD2 may be a length in a direction perpendicular to a direction in which the first crack detection line CD1 and the second crack detection line CD2 are extended.

Figure 2:
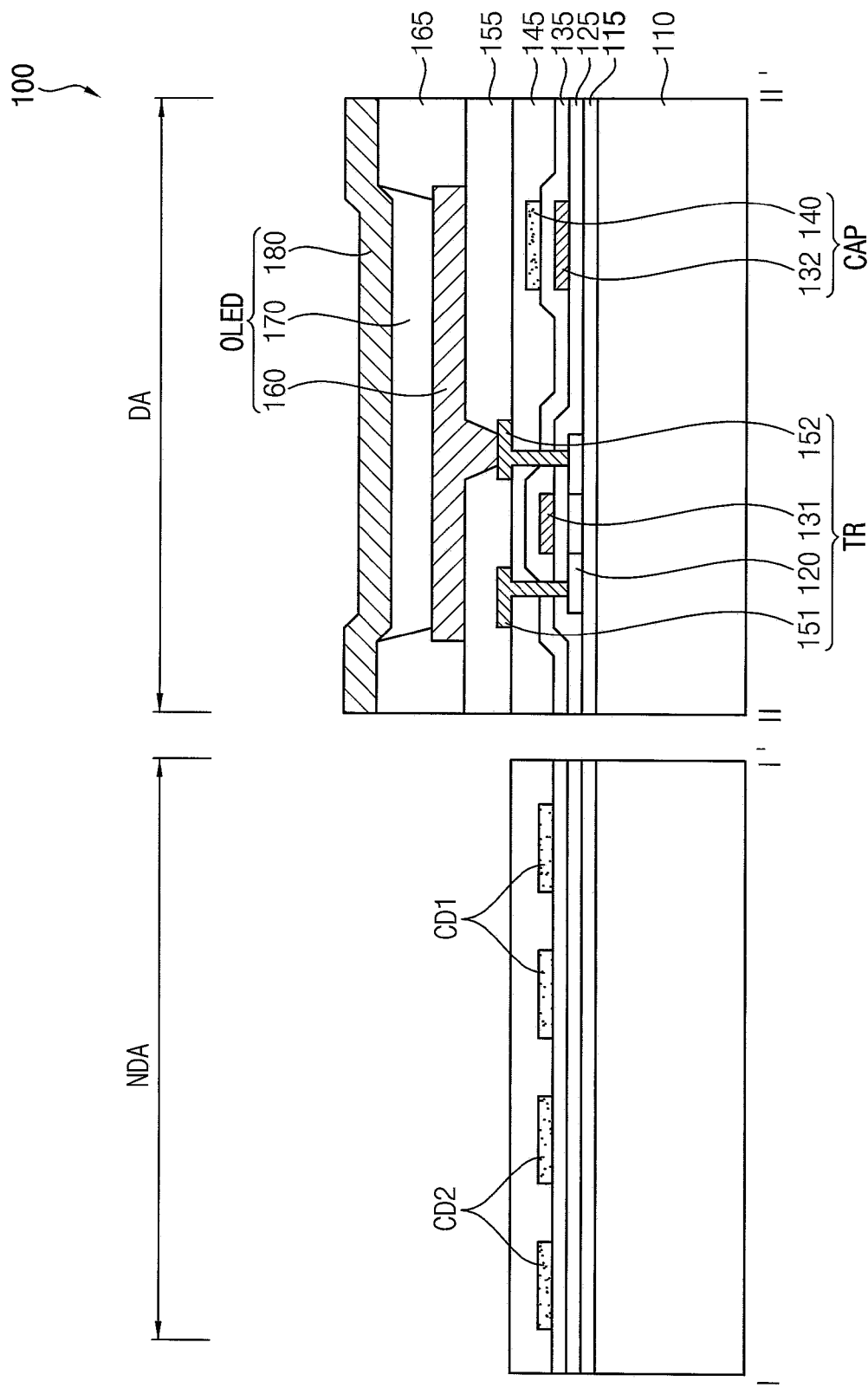
FIG. 2 is a cross-sectional view of the display device of FIG. 1 cut along line I-I' and line II-II'.

FIG. 2 is a cross-sectional view of the display device of FIG. 1 cut along line I-I' and line II-II'.

Referring to FIG. 2, the display device 100 may include the substrate 110, a transistor TR, a capacitor CAP, and an organic light emitting element OLED. The substrate 110 may be formed of glass, quartz, plastic, or the like.

A buffer layer 115 may be disposed on the substrate 110. The buffer layer 115 may prevent impurities from permeating through the substrate 110. Further, the buffer layer 115 may provide a planarized surface thereover. Alternatively, the buffer layer 115 may be omitted according to an exemplary embodiment.

The transistor TR may be disposed on the buffer layer 115 in the display area DA. The transistor TR may apply current to the organic light emitting element OLED. FIG. 2 shows that the transistor TR has a top gate structure, however, the inventive concepts are not limited thereto, and the display device 100 may include a transistor having a bottom gate structure, for example. The transistor TR may include a semiconductor layer 120, a gate electrode 131, a source electrode 151, and a drain electrode 152.

The capacitor CAP may be disposed on the buffer layer 115 in the display area DA. The capacitor CAP may maintain a voltage of the transistor TR. The capacitor CAP may include a lower electrode 132 and an upper electrode 140.

The semiconductor layer 120 may be disposed on the buffer layer 115. The semiconductor layer 120 may include amorphous silicon, polycrystalline silicon, or the like. Alternatively, the semiconductor layer 120 may include an oxide semiconductor.

A gate insulation layer 125 covering the semiconductor layer 120 may be disposed on the buffer layer 115. The gate insulation layer 125 may insulate the gate electrode 131 from the semiconductor layer 120. The gate insulation layer 125 may include silicon nitride ($SiN_x$), silicon oxide ($SiO_x$), or the like.

The gate electrode 131 and the lower electrode 132 may be disposed on the gate insulation layer 125. The gate electrode 131 may overlap the semiconductor layer 120. The lower electrode 132 may be spaced apart from the gate electrode 131. The gate electrode 131 and the lower electrode 132 may include gold (Au), silver (Ag), copper (Cu), nickel (Ni), platinum (Pt), palladium (Pa), aluminum (Al), molybdenum (Mo), or titanium (Ti).

In an exemplary embodiment, the gate electrode 131 and the lower electrode 132 may be formed on the same layer. The gate electrode 131 and the lower electrode 132 may include substantially the same material.

A first insulation interlayer 135 covering the gate electrode 131 and the lower electrode 132 may be disposed on the gate insulation layer 125. The first insulation interlayer 135 may insulate the upper electrode 140 from the lower electrode 132. The first insulation interlayer 135 may include silicon nitride ($SiN_x$), silicon oxide ($SiO_x$), or the like.

The upper electrode 140 may be disposed on the first insulation interlayer 135. The upper electrode 140 may overlap the lower electrode 132. The upper electrode 140 may include Au, Ag, Cu, Ni, Pt, Pa, Al, Mo, or Ti.

A second insulation interlayer 145 covering the upper electrode 140 may be disposed on the first insulation interlayer 135. The first insulation interlayer 135 and the second insulation interlayer 145 may insulate the source electrode 151 and the drain electrode 152 from the gate electrode 131. The second insulation interlayer 145 may include silicon nitride ($SiN_x$), silicon oxide ($SiO_x$), or the like.

The source electrode 151 and the drain electrode 152 may be disposed on the second insulation interlayer 145. The source electrode 151 and the drain electrode 152 may be in contact with the semiconductor layer 120. For example, the source electrode 151 and the drain electrode 152 may be in contact with the semiconductor layer 120 through contact holes formed in the gate insulation layer 125, the first insulation interlayer 135, and the second insulation interlayer 145, respectively. The source electrode 151 and the drain electrode 152 may include Au, Ag, Cu, Ni, Pt, Pa, Al, Mo, or Ti. For example, the source electrode 151 and the drain electrode 152 may have a multi-layered structure, such as Mo/Al/Mo or Ti/Al/Ti.

A planarization layer 155 covering the transistor TR may be disposed on the second insulation interlayer 145. The planarization layer 155 may provide a planarized surface thereover. The planarization layer 155 may include photosensitive organic material, such as photoresist, polyacrylate based resin, polyimide based resin, siloxane based resin, acryl based resin, epoxy based resin, or the like.

The organic light emitting element OLED may be disposed on the planarization layer 155 in the display area DA. The organic light emitting element OLED may emit light based on the current applied from the transistor TR. The organic light emitting element OLED may include a first electrode 160, an organic light emitting layer 170, and a second electrode 180.

The first electrode 160 may be disposed on the planarization layer 155 in the display area DA. The first electrode 160 may be patterned per each pixel. The first electrode 160 may be in contact with the drain electrode 152. For example, the first electrode 160 may be in contact with the drain electrode 152 through a contact hole formed in the planarization layer 155. The first electrode 160 may be a reflective electrode. The first electrode 160 may include a reflective layer formed of silver (Ag), magnesium (Mg), aluminum (Al), platinum (Pt), palladium (Pa), gold (Au), nickel (Ni), neodymium (Nd), iridium (Ir), chromium (Cr), or the like, and a transmitting layer formed of indium tin oxide (ITO), indium zinc oxide (IZO), zinc oxide (ZnO), indium oxide ($In_2O_3$). For example, the first electrode 160 may have a multi-layered structure, such as ITO/Ag/ITO.

A pixel defining layer 165 covering the first electrode 160 may be disposed on the planarization layer 155. The pixel defining layer 165 may include an opening exposing a center portion of the first electrode 160 by covering an edge of the first electrode 160. The pixel defining layer 165 may include photosensitive organic material, such as photoresist, polyacrylate based resin, polyimide based resin, siloxane based resin, acryl based resin, epoxy based resin, or the like.

An organic light emitting layer 170 may be disposed on the first electrode 160. The organic light emitting layer 170 may be disposed inside the opening of the pixel defining layer 165.

The second electrode 180 may be disposed on the organic light emitting layer 170. The second electrode 180 may be commonly provided for the pixels. The second electrode 180 may be a transmitting electrode. For example, the second electrode 180 may be formed of metal, a mixture thereof, a nitride thereof, a conductive metal oxide, a transparent conductive material, or the like.

The first crack detection line CD1 and the second crack detection line CD2 may be disposed on the substrate 110 in the non-display area NDA. The first crack detection line CD1 may be disposed outside the display area DA, and the second crack detection line CD2 may be disposed outside the first crack detection line CD1.

The first crack detection line CD1 and the second crack detection line CD2 may be disposed on the same layer. In an exemplary embodiment, the first crack detection line CD1 and the second crack detection line CD2 may be disposed on the same layer as one of the gate electrode 131 of the transistor TR and the upper electrode 140 of the capacitor CAP. For example, the first crack detection line CD1 and the second crack detection line CD2 may be disposed on the same layer as the upper electrode 140 disposed on the first insulation interlayer 135 as illustrated in FIG. 2. However, the inventive concepts are not limited thereto, and the first crack detection line CD1 and the second crack detection line CD2 may be disposed on the same layer as the gate electrode 131, which is disposed on the gate insulation layer 125.

Figure 3:
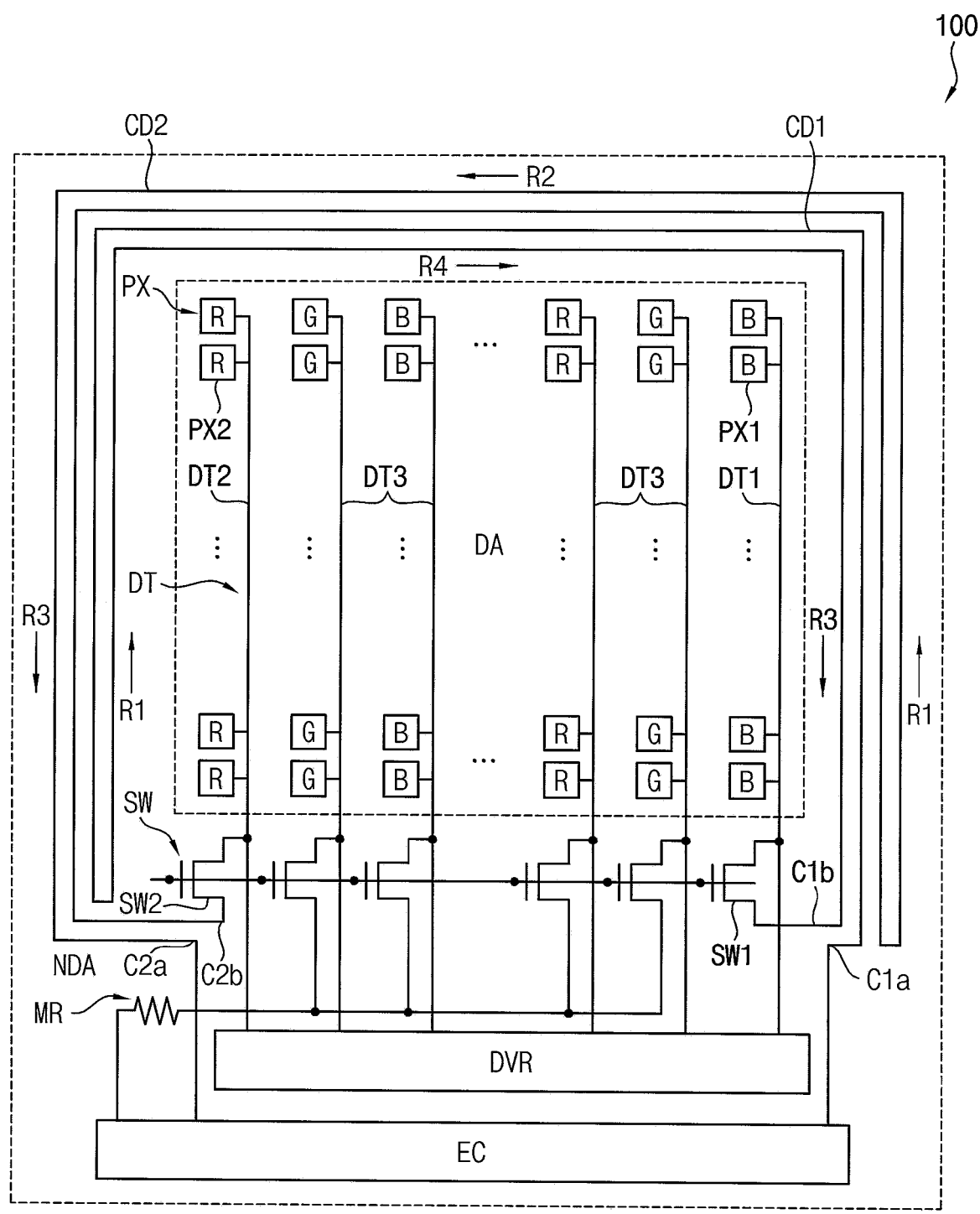
FIG. 3 is a layout view of the display device of FIG. 1.

FIG. 3 is a layout view of the display device of FIG. 1.

Referring to FIG. 3, the display device 100 may include the pixels PX, a plurality of data lines DT, a driver DVR, the first crack detection line CD1, the second crack detection line CD2, a matching resistor MR, an external circuit EC, and switching elements SW.

The pixels PX may include a plurality of red pixels R, a plurality of green pixels G, and a plurality of blue pixels B. The red pixel R, the green pixel G, and the blue pixel B may emit red light, green light, and blue light, respectively. FIG. 3 illustrates that the pixels PX are disposed in a stripe form, in which the red pixels R, the green pixels G, and the blue pixels B are sequentially arranged in a row direction. However, the inventive concepts are not limited thereto, and the pixels PX may be arranged as various forms.

The data lines DT may be connected to the pixels PX. The data lines DT may extend in a column direction, and may be sequentially arranged in the row direction. Each of the data lines DT may be connected to respective pixels PX. For example, each of the data lines DT may be connected to a respective pixel column including the pixels PX.

The data lines DT may include a first data line DT1 electrically connected to a pixel column including a first pixel PX1, and a second data line DT2 electrically connected to a pixel column including a second pixel PX2.

In an exemplary embodiment, the first pixel PX1 and the second pixel PX2 may emit light of different colors from each other. For example, the first pixel PX1 may emit one of red color and blue color, and the second pixel PX2 may emit the other one of red color and blue color. FIG. 3 illustrates that the first pixel PX1 and the second pixel PX2 are blue pixel B and the red pixel R, respectively. However, the inventive concepts are not limited thereto, and the first pixel PX1 may be one of red pixel R, green pixel G, and blue pixel B, and the second pixel PX2 may be the other one of the remaining red pixel R, green pixel G, and blue pixel B.

The data lines DT may be connected to the driver DVR. The data lines DT may transmit data voltages received from the driver DVR to the pixels PX. The pixels PX may emit light based on the data voltages received from the data lines DT. In an exemplary embodiment, transistors included in the pixels PX may be p-channel MOSFET (PMOS). In this case, when a data voltage having a relatively small magnitude is applied to the pixel PX, the pixel PX may emit relatively bright light. Further, when a data voltage having a relatively large magnitude is applied to the pixel PX, the pixel PX may emit relatively dark light. However, the inventive concepts are not limited thereto, and in another exemplary embodiment, transistors included in the pixels PX may be n-channel MOSFET (NMOS).

The first crack detection line CD1 may be electrically connected to one of the data lines DT. For example, the first crack detection line CD1 may be electrically connected to the first data line DT1 among the data lines DT. The first crack detection line CD1 may be electrically connected to the first data line DT1 through a second connecting portion C1b. For example, the first crack detection line CD1 may extend from a first connecting portion C1a along the non-display area NDA adjacent to an edge of the display area DA in a first direction R1, a second direction R2 perpendicular to the first direction R1, and a third direction R3 opposite to the first direction R1, and then may change a direction and extend in the first direction R1, a fourth direction R4 opposite to the second direction R2, and the third direction R3, thereby being electrically connected to the first data line DT1 through the second connecting portion C1b.

The second crack detection line CD2 may be electrically connected to one of the data lines DT. For example, the second crack detection line CD2 may be electrically connected to the second data line DT2 among the data lines DT. The second crack detection line CD2 may be electrically connected to the second data line DT2 through a fourth connecting portion C2b. For example, the second crack detection line CD2 may extend from a third connecting portion C2a along the non-display area NDA adjacent to the edge of the display area DA in the first direction R1, the fourth direction R4, and the third direction R3, and then may change a direction and extend in the first direction R1, the second direction R2, and the third direction R3, thereby being electrically connected to the second data line DT2 through the fourth connecting portion C2b.

The matching resistor MR may be disposed in the non-display area NDA. An end of the matching resistor MR may be electrically connected to third data lines DT3 adjacent to the first data line DT1 or the second data line DT2 among the data lines DT. For example, the third data lines DT3 may be the remaining data lines other than the first data line DT1 and the second data line DT2. The matching resistor MR may compensate resistance differences between the first and second data lines DT1 and DT2, which are connected to the first and second crack detection lines CD1 and CD2, respectively, and the third data lines DT3, which are not connected to the first and second crack detection lines CD1 and CD2. Accordingly, the resistance of the matching resistor MR may be determined in consideration of the resistance of the first crack detection line CD1 and the resistance of the second crack detection line CD2.

The first crack detection line CD1, the second crack detection line CD2, and the matching resistor MR may be electrically connected to the external circuit EC. The first crack detection line CD1 may be electrically connected to the external circuit EC through the first connecting portion C1a, and the second crack detection line CD2 may be electrically connected to the external circuit EC through the third connecting portion C2a. Further, the other end of the matching resistor MR may be electrically connected to the external circuit EC. The data lines DT may transmit test voltages received from the external circuit EC through the first crack detection line CD1, the second crack detection line CD2, and the matching resistor MR to the pixels PX. The pixels PX may emit light based on the test voltages received from the data lines DT.

The switching elements SW may selectively connect the data lines DT to the first crack detection line CD1, the second crack detection line CD2, and the matching resistor MR. The switching elements SW may include a first switching element SW1 connecting the first data line DT1 to the first crack detection line CD1, and a second switching element SW2 connecting the second data line DT2 to the second crack detection line CD2.

Hereinafter, a method of driving a display device according to an exemplary embodiment will be described with reference to FIG. 4.

Figure 4:
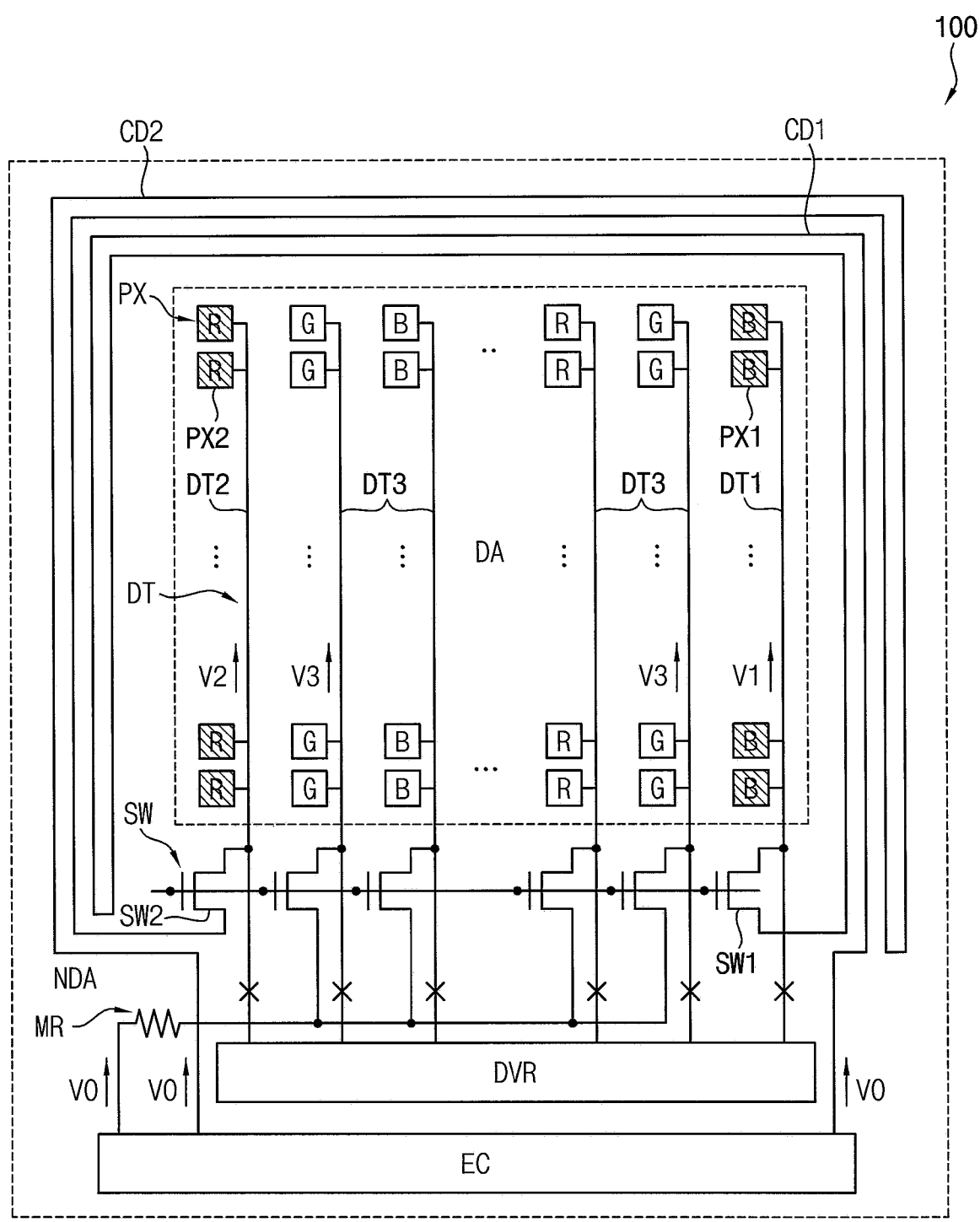
FIG. 4 is a diagram illustrating a method of driving the display device of FIG. 3.

FIG. 4 is a diagram illustrating a method of driving the display device of FIG. 3.

Referring to FIG. 4, first, the driver DVR may be inactivated. In this case, data voltage may not be applied to the data lines DT from the driver DVR.

Then, whether a crack has occurred or not in the non-display area NDA may be determined. More specifically, the data lines DT may be connected to the first crack detection line CD1, the second crack detection line CD2, and the matching resistor MR by turning on the switching elements SW. Then, test voltages V0 may be applied from the external circuit EC to the first crack detection line CD1, the second crack detection line CD2, and the matching resistor MR. Here, the test voltages V0 applied to the first crack detection line CD1, the second crack detection line CD2, and the matching resistor MR may have the same magnitude of voltage.

The test voltage V0 transmitted through the first crack detection line CD1 may be dropped by a resistance of the first crack detection line CD1, and a first test voltage V1 having a magnitude less than the test voltage V0 may be applied to the first data line DT1. The test voltage V0 transmitted through the second crack detection line CD2 may be dropped by a resistance of the second crack detection line CD2, and a second test voltage V2 having a magnitude less than the test voltage V0 may be applied to the second data line DT2. Further, the test voltage V0 transmitted through the matching resistor MR may be dropped by a resistance of the matching resistor MR, and a third test voltage V3 having a magnitude less than the test voltage V0 may be applied to the third data lines DT3.

If the first crack detection line CD1 and the second crack detection line CD2 are not cracked, the resistance of the matching resistor MR may be greater than the resistance of the first crack detection line CD1 and the resistance of the second crack detection line CD2. In this case, the third test voltage V3 may have a magnitude less than those of the first test voltage V1 and the second test voltage V2. For example, when the test voltage V0 having a magnitude of about 10V is applied from the external circuit EC, each of the first test voltage V1 and the second test voltage V2 may have a magnitude of about 8V, and the third test voltage V3 may have a magnitude of about 7.5V. Accordingly, voltages having a magnitude greater than those of the third data lines DT3 may be applied to the first data line DT1 and the second data line DT2, and the first pixel PX1 and the second pixel PX2 may emit light darker than those of the pixels PX in other pixel columns.

If the first crack detection line CD1 and the second crack detection line CD2 are cracked, the resistances of the first crack detection line CD1 and the second crack detection line CD2 may be increased, and the resistance of the matching resistor MR may be less than the resistance of the first crack detection line CD1 and the resistance of the second crack detection line CD2. In this case, the third test voltage V3 may have a magnitude greater than those of the first test voltage V1 and the second test voltage V2. For example, when the test voltage V0 having a magnitude of about 10V is applied from the external circuit EC, each of the first test voltage V1 and the second test voltage V2 may have a magnitude of about 6V, and the third test voltage V3 may have a magnitude of about 7.5V. Accordingly, voltages having a magnitude less than those of the third data lines DT3 may be applied to the first data line DT1 and the second data line DT2, and the first pixel PX1 and the second pixel PX2 may emit light brighter than those of the pixels PX in other pixel columns.

When the first crack detection line CD1 is cracked, the first pixel PX1 may emit light brighter than those of the pixels PX in other pixel columns. Accordingly, when a pixel column including the first pixel PX1 emits light brighter than other pixel columns in response to the test voltage V0 applied from the external circuit EC, it may be determined that a crack has occurred at an inner portion of the non-display area NDA. For example, when a bright line of blue color is observed when the external circuit EC applies the test voltage V0, it may be determined that a crack has occurred at the inner portion of the non-display area NDA.

When the second crack detection line CD2 is cracked, the second pixel PX2 may emit light brighter than those of the pixels PX in other pixel columns. Accordingly, when a pixel column including the second pixel PX2 emits light brighter than other pixel columns in response to the test voltage V0 applied from the external circuit EC, it may be determined that a crack has occurred at an outer portion of the non-display area NDA. For example, when a bright line of red color is observed when the external circuit EC applies the test voltage V0, it may be determined that a crack has occurred at the outer portion of the non-display area NDA.

The display device 100 according to an exemplary embodiment may include the first crack detection line CD1 and the second crack detection line CD2 disposed outside the first crack detection line CD1, so that whether a crack has occurred or not may be determined, as well as identifying relative position of the crack with respect to the display area DA.

Effects on the pixels PX disposed in the display area DA may be different according to the distance from the display area DA to the place where the crack has occurred. For example, a crack occurred at the inner portion of the non-display area NDA may have a greater effect on the pixels PX than a crack occurred at the outer portion of the non-display area NDA. In the display device 100 according to the illustrated exemplary embodiment, the relative position of the crack from the display area DA may be determined, as well as whether a crack has occurred or not, so that yield of the display device may be improved.

Hereinafter, elements of a display device according to another exemplary embodiment will be described with reference to FIGS. 5 and 6.

Figure 5:
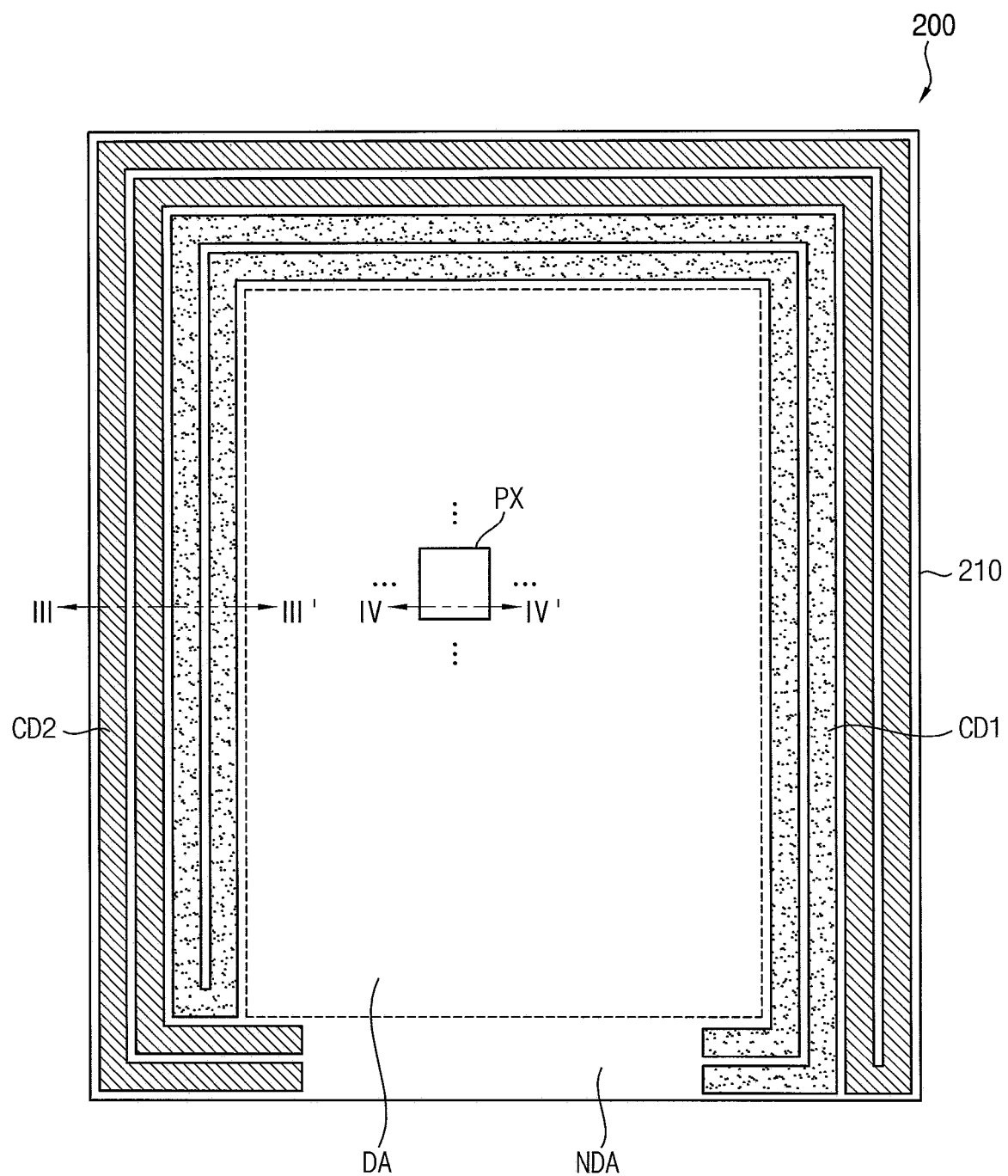
FIG. 5 is a plan view of a display device according to another exemplary embodiment.

FIG. 5 is a plan view of a display device according to another exemplary embodiment. FIG. 6 is a cross-sectional view of the display device of FIG. 5 cut along line III-III' and line IV-IV'.

Figure 6:
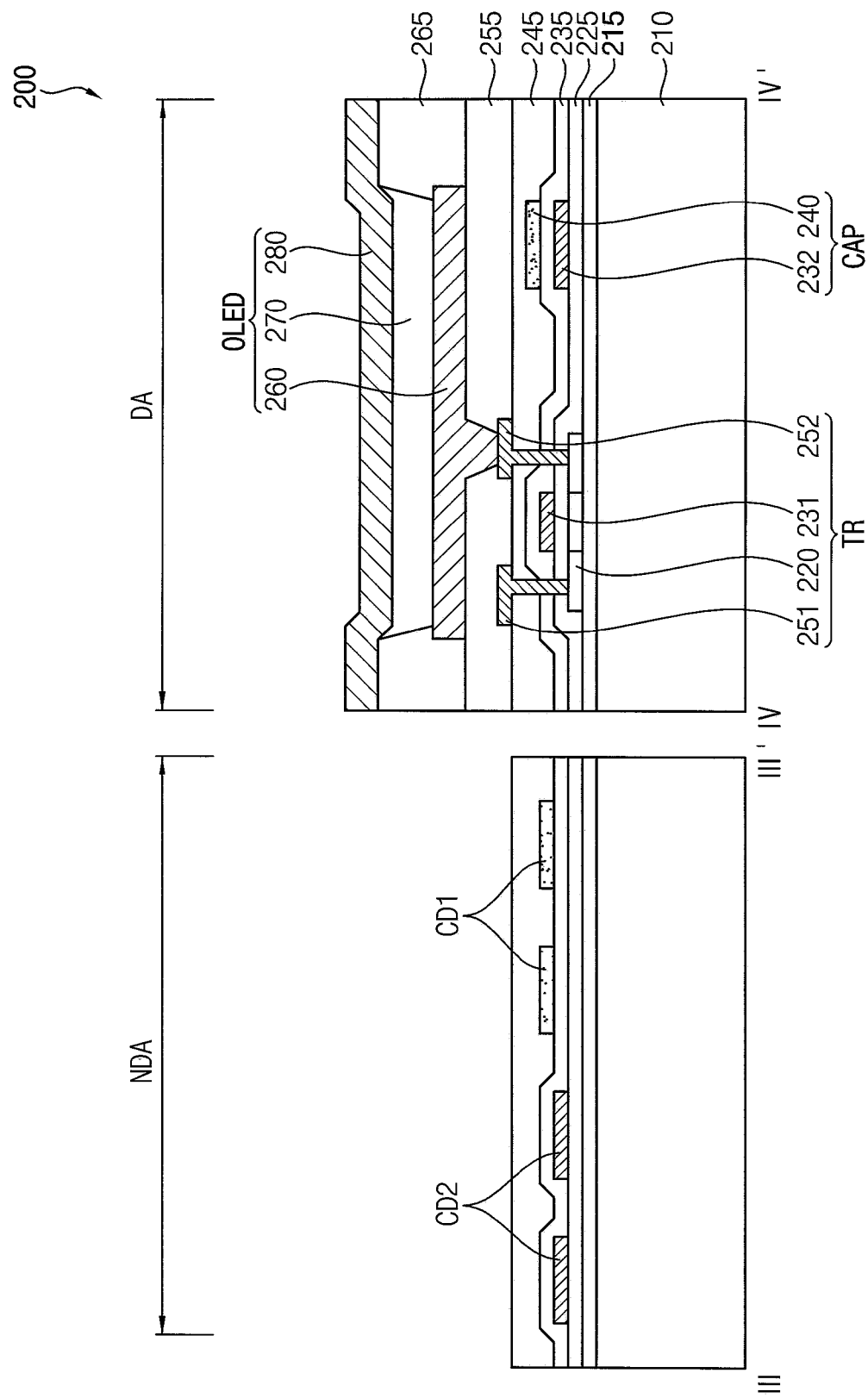
FIG. 6 is a cross-sectional view of the display device of FIG. 5 cut along line III-III' and line IV-IV'.

Referring to FIGS. 5 and 6, a display device 200 according to another exemplary embodiment may include a substrate 210, a plurality of pixels PX, a first crack detection line CD1, and a second crack detection line CD2. Each of the pixels PX may include a transistor TR, a capacitor CAP, and an organic light emitting element OLED. The display device 200 may include substantially the same elements as those of the display device 100 shown in FIGS. 1 and 2, and thus, detailed descriptions of the substantially the same elements will be omitted to avoid redundancy.

The first crack detection line CD1 and the second crack detection line CD2 may be disposed in the non-display area NDA of the substrate 210. The first crack detection line CD1 may be disposed outside the display area DA, and the second crack detection line CD2 may be disposed outside the first crack detection line CD1.

The first crack detection line CD1 and the second crack detection line CD2 may be disposed on different layers from each other. In an exemplary embodiment, the first crack detection line CD1 may be disposed on the same layer as one of a gate electrode 231 of the transistor TR and an upper electrode 240 of the capacitor CAP, and the second crack detection line CD2 may be disposed on the same layer as the other of the gate electrode 231 of the transistor TR and the upper electrode 240 of the capacitor CAP. For example, the first crack detection line CD1 may be disposed on the same layer as the upper electrode 240 disposed on a first insulation interlayer 135, and the second crack detection line CD2 may be disposed on the same layer as the gate electrode 231 disposed on a gate insulation layer 225 as illustrated in FIG. 6. However, the inventive concepts are not limited thereto, and the first crack detection line CD1 may be disposed on the same layer as the gate electrode 231, and the second crack detection line CD2 may be disposed on the same layer as the upper electrode 240.

The display device 200 according to another exemplary embodiment may include the first crack detection line CD1 and the second crack detection line CD2 disposed outside the first crack detection line CD1, and the first crack detection line CD1 and the second crack detection line CD2 may be disposed on different layers from each other. Therefore, it is possible to determine whether a crack has occurred or not, a relative position of the crack from the display area DA, and a relative position of a layer to which a crack has occurred from the substrate 210.

Hereinafter, elements of a display device according to still another exemplary embodiment will be described with reference to FIG. 7.

Figure 7:
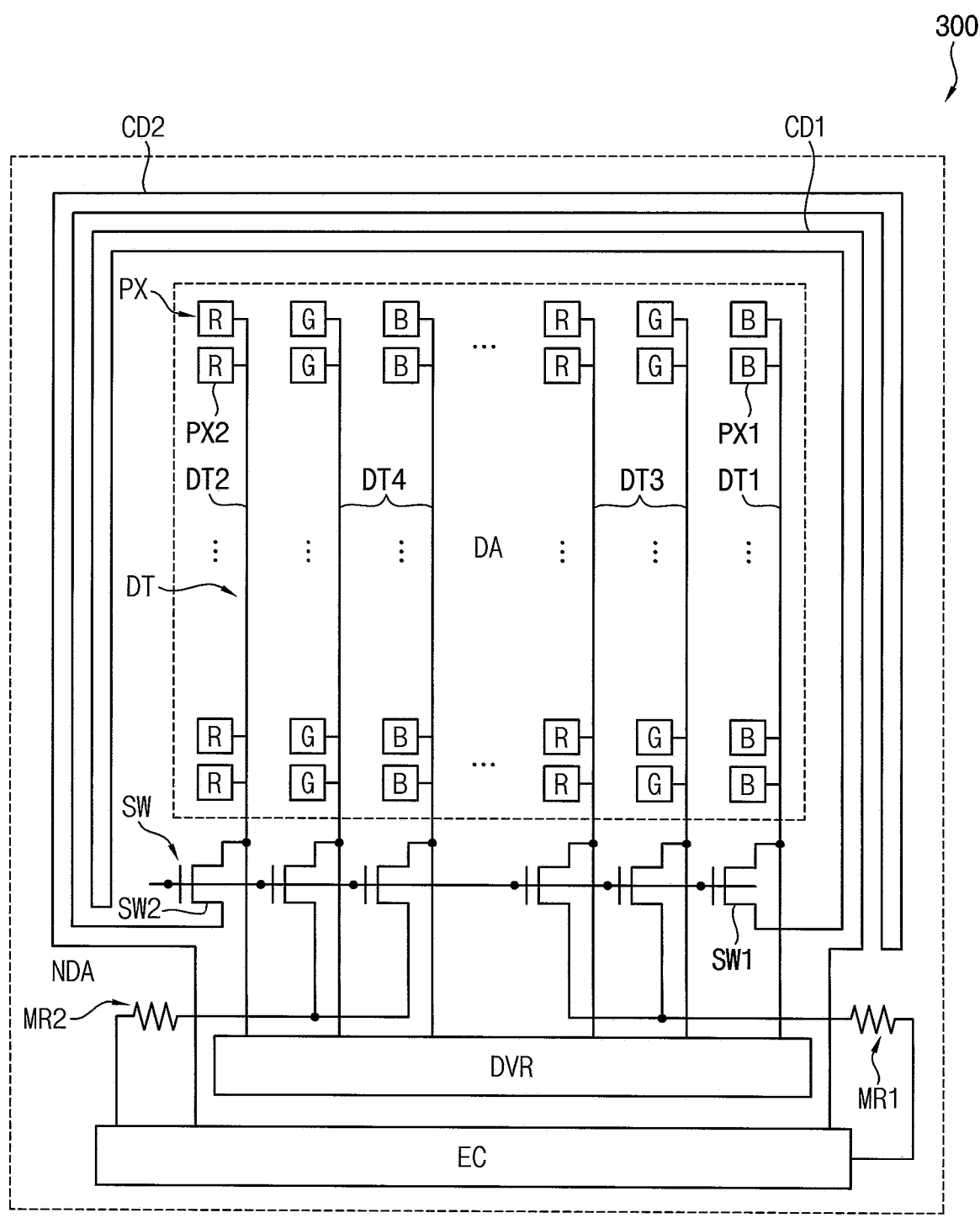
FIG. 7 is a layout view of a display device according to still another exemplary embodiment.

FIG. 7 is a plan view illustrating the display device according to still another exemplary embodiment.

Referring to FIG. 7, a display device 300 according to still another exemplary embodiment may include pixels PX, a plurality of data lines DT, a driver DVR, a first crack detection line CD1, a second crack detection line CD2, a first matching resistor MR1, a second matching resistor MR2, an external circuit EC, and switching elements SW. The display device 300 may include substantially the same elements as those of the display device 100 shown in FIG. 3, and thus, detailed descriptions of the substantially the same elements will be omitted to avoid redundancy.

The first matching resistor MR1 and the second matching resistor MR2 may be disposed in the non-display area NDA. An end of the first matching resistor MR1 may be electrically connected to third data lines DT3 adjacent to the first data line DT1 among the data lines DT, and an end of the second matching resistor MR2 may be electrically connected to fourth data lines DT4 adjacent to the second data line DT2 among the data lines DT. For example, the third data lines DT3 and the fourth data lines DT4 may be the remaining data lines other than the first data line DT1 and the second data line DT2. The number of the third data lines DT3 and the number of the fourth data lines DT4 may be substantially the same. The first matching resistor MR1 may compensate resistance differences between the first data line DT1, which is connected to the first crack detection line CD1, and the third data lines DT3, which are not connected to the first crack detection line CD1. Further, the second matching resistor MR2 may compensate resistance differences between the second data line DT2, which is connected to the second crack detection line CD2, and the fourth data lines DT4, which are not connected to the second crack detection line CD2. Accordingly, the resistance of the first matching resistor MR1 and the resistance of the second matching resistor MR2 may be determined in consideration of the resistance of the first crack detection line CD1 and the resistance of the second crack detection line CD2, respectively.

The first crack detection line CD1, the second crack detection line CD2, the first matching resistor MR1, and the second matching resistor MR2 may be electrically connected to the external circuit EC. The other end of the first matching resistor MR1 and the other end of the second matching resistor MR2 may be electrically connected to the external circuit EC. The data lines DT may transmit test voltages received from the external circuit EC through the first crack detection line CD1, the second crack detection line CD2, the first matching resistor MR1, and the second matching resistor MR2 to the pixels PX. The pixels PX may emit light based on the test voltages received from the data lines DT.

The switching elements SW may selectively connect the data lines DT to the first crack detection line CD1, the second crack detection line CD2, the first matching resistor MR1, and the second matching resistor MR2.

Hereinafter, a method of driving the display device according to still another exemplary embodiment will be described with reference to FIG. 8.

Figure 8:
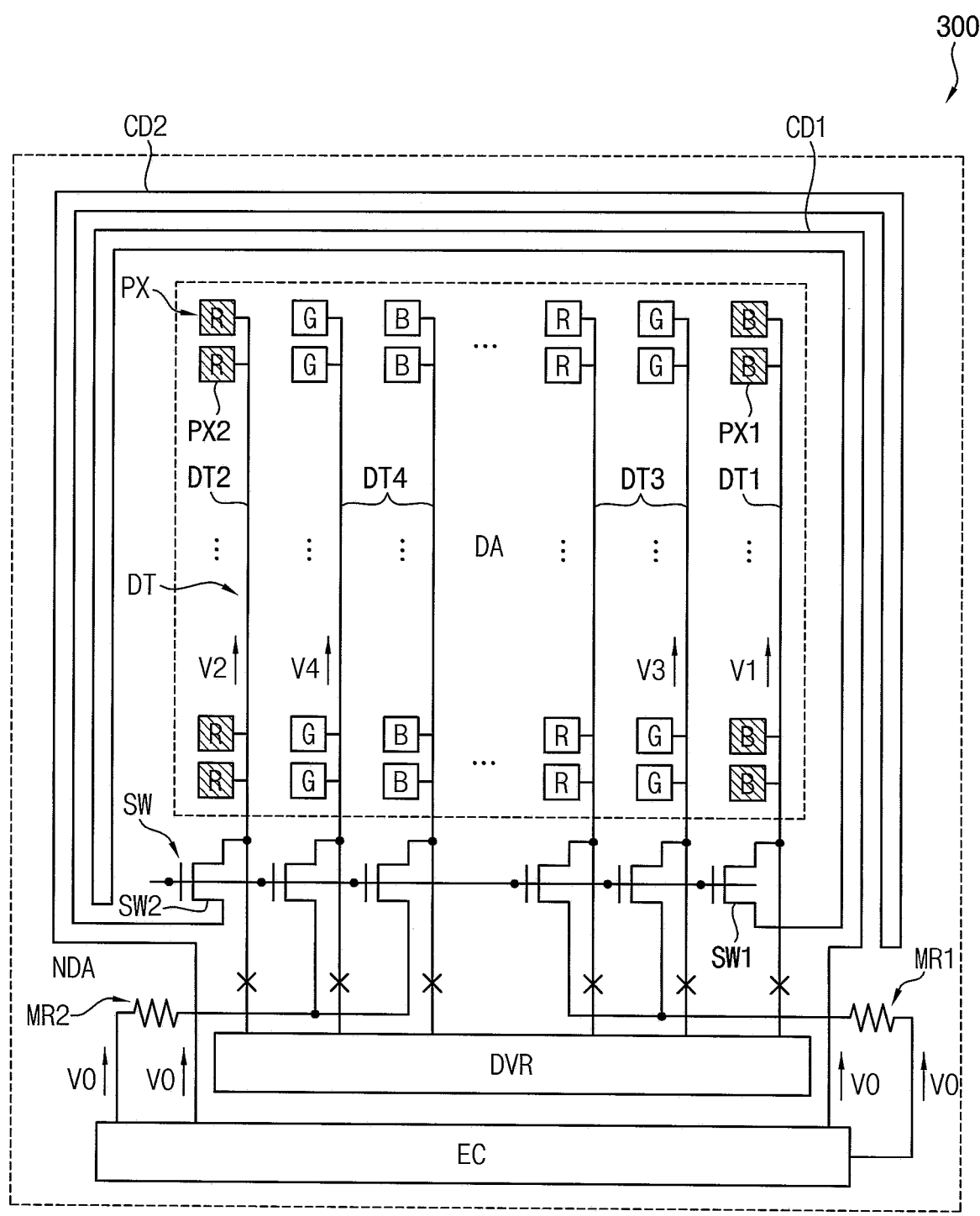
FIG. 8 is a diagram illustrating a method of driving the display device of FIG. 7.

FIG. 8 is a diagram illustrating a method of driving the display device of FIG. 7.

Referring to FIG. 8, first, the driver DVR may be inactivated. In this case, data voltage may not be applied to the data lines DT from the driver DVR.

Then, whether a crack has occurred or not in the non-display area NDA may be determined. More specifically, the data lines DT may be connected to the first crack detection line CD1, the second crack detection line CD2, the first matching resistor MR1, and the second matching resistor MR2 by turning on the switching elements SW. Then, test voltages V0 may be applied from the external circuit EC to the first crack detection line CD1, the second crack detection line CD2, the first matching resistor MR1, and the second matching resistor MR2. Here, the test voltages V0 applied to the first crack detection line CD1, the second crack detection line CD2, the first matching resistor MR1, and the second matching resistor MR2 may have the same magnitude of voltage.

The test voltage V0 transmitted through the first crack detection line CD1 may be dropped by a resistance of the first crack detection line CD1, and a first test voltage V1 having a magnitude less than the test voltage V0 may be applied to the first data line DT1. The test voltage V0 transmitted through the second crack detection line CD2 may be dropped by a resistance of the second crack detection line CD2, and a second test voltage V2 having a magnitude less than the test voltage V0 may be applied to the second data line DT2. Further, the test voltage V0 transmitted through the first matching resistor MR1 may be dropped by a resistance of the first matching resistor MR1, and a third test voltage V3 having a magnitude less than the test voltage V0 may be applied to the third data lines DT3. The test voltage V0 transmitted through the second matching resistor MR2 may be dropped by a resistance of the second matching resistor MR2, and a fourth test voltage V4 having a magnitude less than the test voltage V0 may be applied to the fourth data lines DT4.

If the first crack detection line CD1 and the second crack detection line CD2 are not cracked, the resistance of the first matching resistor MR1 may be greater than the resistance of the first crack detection line CD1, and the resistance of the second matching resistor MR2 may be greater than the resistance of the second crack detection line CD2. In this case, the third test voltage V3 may have a magnitude less than that of the first test voltage V1, and the fourth test voltage V4 may have a magnitude less than that of the second test voltage V2. Accordingly, voltages having magnitudes greater than those of the third data lines DT3 and the fourth data lines DT4 may be applied to the first data line DT1 and the second data line DT2, respectively, and the first pixel PX1 and the second pixel PX2 may emit light darker than those of the pixels PX in other pixel columns.

If the first crack detection line CD1 and the second crack detection line CD2 are cracked, the resistances of the first crack detection line CD1 and the second crack detection line CD2 may be increased. As such, the resistance of the first matching resistor MR1 may be less than the resistance of the first crack detection line CD1, and the resistance of the second matching resistor MR2 may be less than the resistance of the second crack detection line CD2. In this case, the third test voltage V3 may have a magnitude greater than that of the first test voltage V1, and the fourth test voltage V4 may have a magnitude greater than that of the second test voltage V2. Accordingly, voltages having magnitudes less than those of the third data lines DT3 and the fourth data lines DT4 may be applied to the first data line DT1 and the second data line DT2, respectively. In this manner, the first pixel PX1 and the second pixel PX2 may emit light brighter than those of the pixels PX in other pixel columns.

In an exemplary embodiment, the resistance of the second matching resistor MR2 may be greater than the resistance of the first matching resistor MR1. When the first crack detection line CD1 and the second crack detection line CD2 are not cracked, the resistance of the first matching resistor MR1 may be greater than the resistance of the first crack detection line CD1, and the resistance of the second matching resistor MR2 may be greater than the resistance of the second crack detection line CD2. Further, since a length of the second crack detection line CD2 may be greater than a length of the first crack detection line CD1, the resistance of the second crack detection line CD2 may be greater than the resistance of the first crack detection line CD1. Accordingly, the resistance of the second matching resistor MR2, which is connected to the fourth data lines DT4 adjacent to the second data line DT2 connected to the second crack detection line CD2 having a greater length, may be greater than the resistance of the first matching resistor MR1, which is connected to the third data lines DT3 adjacent to the first data line DT1 connected to the first crack detection line CD1 having a shorter length.

When the first crack detection line CD1 is cracked, the first pixel PX1 may emit light brighter than those of pixels PX in other pixel columns connected to the third data lines DT3. Accordingly, when a pixel column including the first pixel PX1 emits light brighter than other pixel columns connected to the third data lines DT3 in response to the test voltage V0 applied from the external circuit EC applies the test voltage V0, it may be determined that a crack has occurred at an inner portion of the non-display area NDA. For example, when a bright line of blue color is observed in response to the test voltage V0 applied from the external circuit EC, it may be determined that a crack has occurred at the inner portion of the non-display area NDA.

When the first crack detection line CD2 is cracked, the second pixel PX2 may emit light brighter than those of pixels PX in other pixel columns connected to the fourth data lines DT4. Accordingly, when a pixel column including the second pixel PX2 emits light brighter than other pixel columns connected to the fourth data lines DT4 in response to the test voltage V0 applied from the external circuit EC, it may be determined that a crack has occurred at an outer portion of the non-display area NDA. For example, when a bright line of red color is observed in response to the test voltage V0 applied from the external circuit EC, it may be determined that a crack has occurred at the outer portion of the non-display area NDA.

The display device according to the exemplary embodiments of the present invention may be applied to a display device included in a computer, a notebook, a mobile phone, a smartphone, a smart pad, a PMP, a PDA, an MP3 player, or the like.

The display device according to the exemplary embodiments may include the first crack detection line disposed in the non-display area and the second crack detection line disposed outside the first crack detection line. Therefore, it may be possible to determine whether a crack has occurred in the display device, as well as identify relative location of the crack.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a display area and a non-display area outside the display area;
a plurality of pixels disposed in the display area on the substrate;
a driving integrated circuit (IC) disposed in the non-display area adjacent to a first side of the display area on the substrate;
a first conductive line disposed in the non-display area on the substrate, the first conductive line surrounding sides of the display area other than the first side; and
a second conductive line disposed in the non-display area on the substrate, the second conductive line continuously disposed along the first conductive line,
wherein the first conductive line is disposed between the display area and the second conductive line,
wherein the first conductive line and the second conductive line are disposed at different layers from each other, and
wherein the first conductive line and the second conductive line are electrically connected to the driving IC.

2. The display device of claim 1, further comprising a plurality of data lines connected to the pixels,
wherein each of the first conductive line and the second conductive line is electrically connected to at least one of the data lines.

3. The display device of claim 2, wherein the second conductive line is electrically connected to a single data line.

4. The display device of claim 1, wherein each of the plurality of pixels comprises:
a transistor comprising a semiconductor layer, a gate insulation layer, a gate electrode, and an insulation interlayer sequentially disposed on the substrate; and
a capacitor comprising a lower electrode disposed on the same layer as the gate electrode and an upper electrode disposed on the insulation interlayer.

5. The display device of claim 4, wherein the first conductive line is disposed on the same layer as one of the gate electrode and the upper electrode, and
wherein the second conductive line is disposed on the same layer as the other one of the gate electrode and the upper electrode.

6. The display device of claim 1, wherein a length of the second conductive line is greater than a length of the first conductive line.

7. The display device of claim 1, wherein each of the first conductive line and the second conductive line has a first portion extending in a clockwise direction, a second portion extending in a counter-clockwise direction, and a third portion connected between the first portion and the second portion.

8. The display device of claim 7, wherein the third portion of the first conductive line and the third portion of the second conductive line are disposed adjacent to opposite sides of the display area, respectively, with the display area in between.

9. The display device of claim 1, wherein the second conductive line entirely surrounds the first conductive line in a second side of the display area opposing the first side.

\* \* \* \* \*